(12) United States Patent
Harasawa et al.

(10) Patent No.: US 7,396,239 B2
(45) Date of Patent: Jul. 8, 2008

(54) ELECTRONIC CARD CONNECTOR

(75) Inventors: Masaaki Harasawa, Yokohama (JP); Hideo Sahara, Yokohama (JP)

(73) Assignee: J.S.T. Mfg. Co., Ltd., Osaka-shi (JP)

( * ) Notice: Subject to any disclaimer, the term of this patent is extended or adjusted under 35 U.S.C. 154(b) by 432 days.

(21) Appl. No.: 11/255,036

(22) Filed: Oct. 21, 2005

(65) Prior Publication Data
US 2006/0088307 A1 Apr. 27, 2006

(30) Foreign Application Priority Data
Oct. 22, 2004 (JP) ............................. 2004-307684

(51) Int. Cl.
*H01R 13/44* (2006.01)
(52) U.S. Cl. ..................................... 439/136
(58) Field of Classification Search .......... 439/135–142
See application file for complete search history.

(56) References Cited

U.S. PATENT DOCUMENTS

| | | | | |
|---|---|---|---|---|
| 4,868,714 A | * | 9/1989 | Banjo et al. .................. | 439/140 |
| 6,669,512 B2 | * | 12/2003 | Lee .............................. | 439/630 |
| 7,112,095 B2 | * | 9/2006 | Shen et al. ................... | 439/138 |
| 2006/0022040 A1 | * | 2/2006 | Obara .......................... | 235/441 |

OTHER PUBLICATIONS

ExpressCard™ Standard Summary; http://www.expresscard.org/web/site/standardsummary.jsp (9 Sheets total.)/Discussed in the specification.

* cited by examiner

*Primary Examiner*—Briggitte R Hammond
(74) *Attorney, Agent, or Firm*—Kratz, Quintos & Hanson, LLP

(57) ABSTRACT

This invention provides an electronic card connector which can connect by smoothly inserting, to one connector, electronic cards of different sizes. An electronic card connector provides a guide case forming a universal slot which has an opening to which two or more different sized electronic cards can be inserted and which provides a connector, which can connect with the above-mentioned electronic cards, which is set in the interior of a universal slot, and in a universal slot, there is installed a freely rotatable shutter member which has a cover of a prescribed length at the end of one side in the longitudinal direction of this opening, and the opening of the universal slot by the cover of this shutter member is shut by opening an opening of a size for which the smallest sized electronic card can be inserted.

2 Claims, 6 Drawing Sheets

ELECTRONIC CARD CONNECTOR

BACKGROUND OF THE INVENTION

1. Field of the Invention

This invention relates to an electronic card connector, and especially, is related to an electronic card connector which is connectable by inserting, in a single connector, electronic cards of different sizes.

2. Description of Related Art

As an electronic card connector which can insert, in a single connector, two electronic cards of different size, for example, the connector used for the Express Card is known.

The Express Card is specified by PCMCIA (Personal Computer Memory Card International Association/Portable Computer Memory Card International Association), and PCMCIA, as "Express Card Version 1.0", in September, 2003, announced the two types of express cards, the "34 module" and the "54 module", providing at the same time, recommended specifications of the connector so as to be able to connect each module to one connector. (For example, reference non-patent citation 1).

FIG. 5 is an exterior perspective view which shows the connection of the two kinds of module and the connector which are disclosed in the PCMCIA specification, and FIG. 6 is an exterior perspective view which turns upside down the connector of FIG. 5 and shows the connection with one of the modules.

The two kinds of Express Cards, that is, "34 module" (hereafter, module 1) and "54 module" (hereafter module 3), as shown in FIG. 5, are formed by a plate-shaped body of rectangular form which has, respectively, a long and short boundary, with specified length and prescribed thickness. Module 1 has opposing long boundaries 1a, 1b and short boundaries 1c, 1d, and a prescribed thickness, and connector 2 is installed on a portion of the short boundary 1d. In addition, elongated thin line protrusions 2a are formed at the end where the connector 2 is installed. This protrusion 2a, when the module 1 is inserted upside down, prevents connection to the later described connector's main body 11, and in addition, when module 1 is normally inserted, there is a mechanism which introduces the module 1 to the connector's main body 11 by contacting with the later described side rail 14.

Moreover, in the PCMCIA specification, the length $L_1$ of the long boundary is 75 mm, and the length of the short boundary $W_1$ is 34 mm, and the thickness is 5 mm.

Module 3 also has, in the same way, opposing long boundaries 3a and 3b and short boundaries 3c and 3d, and a prescribed thickness, and at the corner of the long boundary 3b and short boundary 3d, a notch 4 is formed by the respective shrinkage of prescribed length $L_4$ within the long boundary 3b and $W_3$ within the short boundary 3d. A connector 5 is installed on the short boundary 3d.

Moreover, in the PCMCIA specification, the length $L_1$ of the long boundary 3a is 75 mm, $L_4$ is 22 mm, the length $W_2$ of the short boundary is 54 mm, $W_3$ is 20 mm, and the thickness is 5 mm.

The connector 10A to which each module 1, 3 is connected by insertion, as shown in FIG. 6, has a structure which provides the connector's main body 11 and a guide case 12 which is joined at one end of this connector's main body 11.

The guide case 12 is formed by a top plate 12a, by both side plates 12b, 12c which are formed by bending both side ends of this top plate, and by a back plate 12d which is formed by bending the side plate 12b further towards the side of the side plate 12c. This case 12 is formed by a bending process of a flat metal plate. In addition, the openings 13a, 13b of the narrow groove are formed between both side plates 12b, 12c. Within the openings 13a, 13b of each narrow groove, one of the openings 13a is formed to a size whereby the module 3 can be inserted. In addition, at the other opening 13b, the connector's main body 11 is installed.

Because the opening 13a is of a size which allows insertion of the large-scale module 3, it is possible to insert module 1 which has a smaller size than module 3, and because there results a common opening which allows insertion of both modules 1, 3, this opening can be referred to as a universal slot. Below, this universal slot is simply called "slot."

In addition, the back plate 12d is inclined at one side of the side edges at a prescribed angle by directing from the slot 13a to the other opening 13b, and there is formed a guide surface, which guides towards the connector's main body 11, while in contact with the side end of the protrusion 2a of the module 1, forming the so-called side rail 14.

Each module 1, 3 is respectively connected by insertion to the connector 10A.

Because the opening of the slot 13a of the connector 10A is slightly larger than the exterior of the module 3, it is possible to smoothly insert module 3. That is, when inserting module 3 into slot 13a, the side surfaces 3a, 3b of the module are smoothly pushed in through guiding by the side plates 12b, 12c of the guide case, and the connector 5 of module 3 is connected with the connector's main body 11. In this contact state, because movement is controlled as the module 3 is bounded by the slot 13a and both side plates 12b, 12c, a stable connection is maintained.

However, when there is insertion of the small-sized module 1 in the slot 13a of connector 10A, because the size of the slot 13a has been made of a size that is appropriate for module 3, there results, between each side plate 12b, 12c which formed this slot 13a, for module 1, a so-called fitted state in which there is free movement play so that it is unknown whether there is good insertion at any site of the slot 13a.

Because of this free movement, there is concern that there is not an appropriate connection between the connector 2 of module 1 and the connector's main body 11 within the case. In the PCMCIA specifications, as shown in FIG. 6, there is recommendation of the establishment of a side rail within the slot, making possible the avoidance of the above-mentioned drawback.

SUMMARY OF THE INVENTION

When there is establishment of the side rail 14 inside the slot 13a, if the small-sized module 1 is inserted from the vicinity of the side plate 12b of the slot 13a, for module 1, while the side edge of the protrusion 2a of module 1 is making contact with the side rail 14, there is guidance towards the connector's main body 11, and there is mutual contact between both connectors 2, 11. However, even with the establishment of this kind of side rail 14, because the horizontal width of the slot 13a is wide, the module 1 will insert under conditions in which there is play within this slot.

Because of this free movement, for example, without the module 1 being inserted in a straight line, when inserted in a slanted state, with the side rail 14 not smoothly functioning, the connector 2 of module 1 will not be able to insert, being stopped along the way before reaching the connector's main body 11. Such partial insertions may be the cause of damage to the module or connector. In addition, the module 1, in a state in which there is insertion to the connector's main body 11, is only supported by a portion of both connectors 2, 11 and the short side plate 12e, and the other end of module 1, that is, the portion of the short boundary 1c, freely moves within the slot 13a.

Because of these conditions, the support force for module 1 is extremely weak, and there is concern that both connectors 2, 11 will disengage just by touching portions that project to the outside, and in addition, there is disengagement simply from vibration or impact or the like.

This invention will solve prior art problems. The goal of this invention is to present an electronic card connector that is connectable by smoothly inserting, in one connector, electronic cards of different size.

In order to solve the problems, the invention that is related to this application's claim 1 is characterized by an electronic card connector which provides a guide case in which a universal slot is formed which has an opening through which electronic cards of different sizes can be inserted, and provides a connector which is established in the interior of the universal slot and which connects with the electronic card, and in the universal slot there is installed a freely moveable shutter member which has a cover of prescribed length on the end of one side in the longitudinal direction of the opening, and by the cover of this shutter member, the opening of the universal slot can be shut by opening the size opening through which the smallest sized electronic card is inserted.

In addition, for the invention related to this application's claim 2, in the electronic card connector of claim 1, the guide case forms a housing part which shelters the cover of this shutter member on the side where the shutter member is installed, and when the maximum size electronic card is inserted in the universal slot, the cover of the shutter member is housed in the housing part.

BRIEF DESCRIPTION OF THE DRAWINGS

FIG. 1 shows the electronic card connector which is related to Embodiment 1 of this invention.

FIG. 3 shows the conditions under which there is connection by insertion of the module 1 to this invention's electronic card connector.

FIG. 4 shows the conditions under which there is connection by insertion of module 3 to this invention's electronic card connector.

DETAILED DESCRIPTION OF THE INVENTION

Figure 1A:
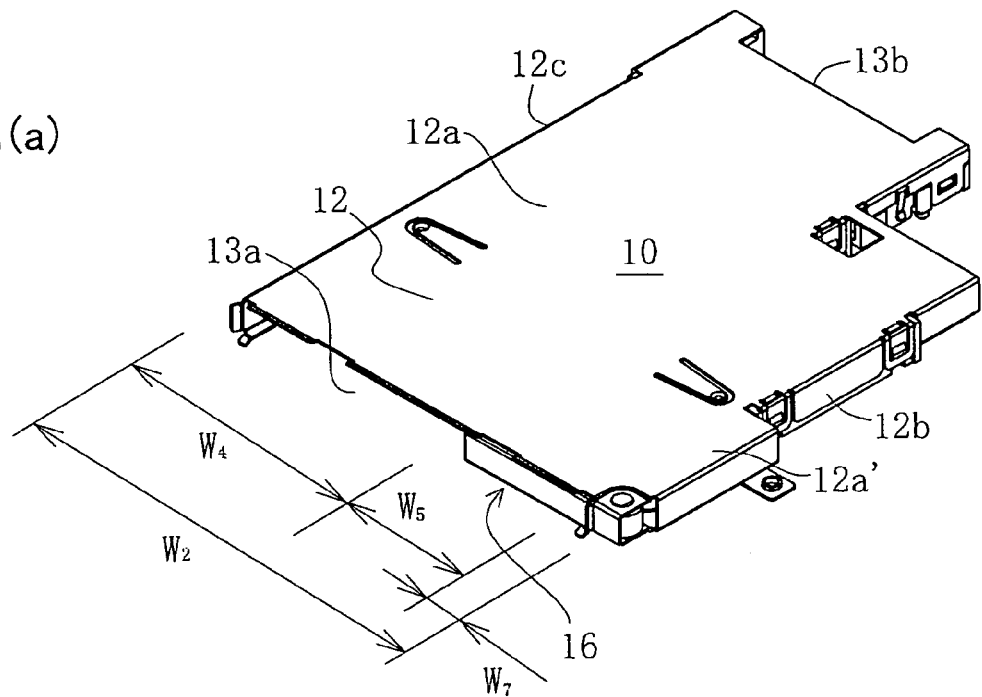
FIG. 1(a) is an exterior perspective view seen from the top surface.
Figure 1B:
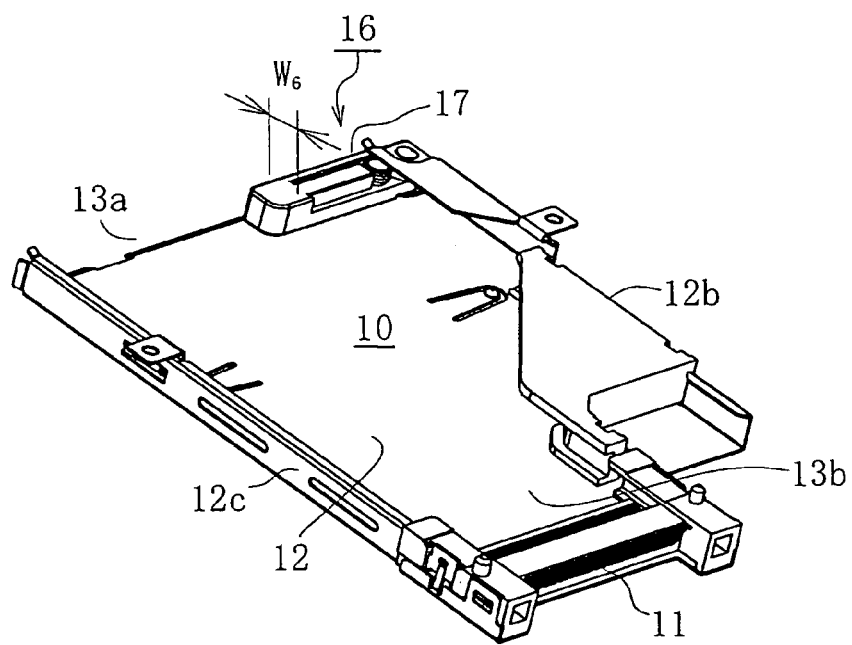
FIG. 1(b) is an exterior perspective view which turns inside out FIG. 1(a).
Figure 2:
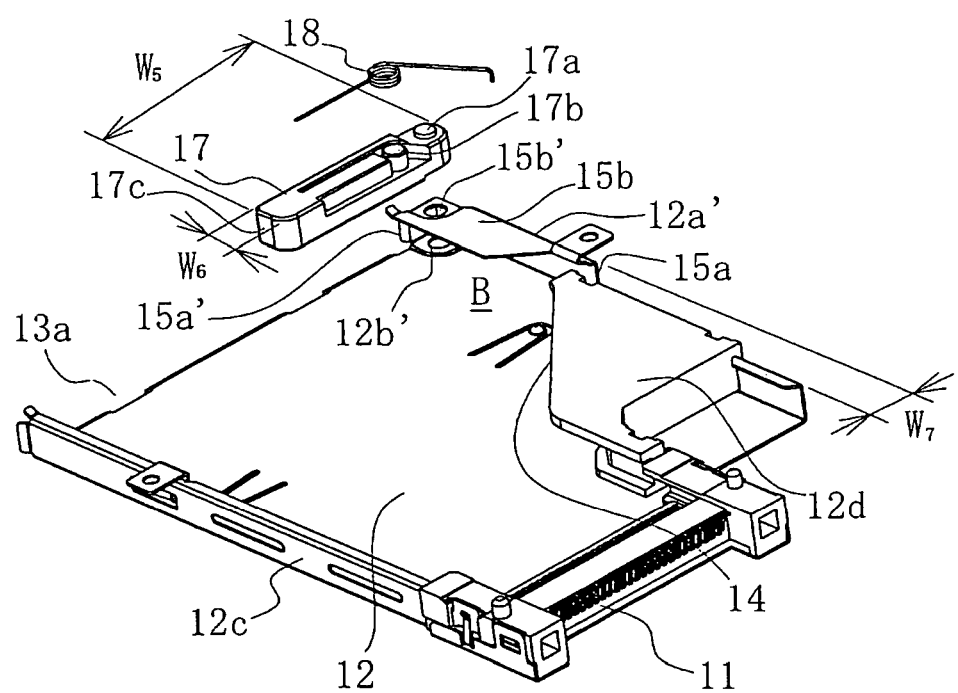
FIG. 2 is an exploded perspective view that explodes the electronic card connector of FIG. 1(b).

FIG. 1 shows an electronic card connector 10 which is related to Embodiment 1, and FIG. 1(a) is an exterior perspective view which is seen from the top surface, with FIG. 1(b), an exterior perspective view that turns FIG. 1(a) inside out. FIG. 2 is an exploded perspective view that explodes the electronic card connector of FIG. 1(b).

Because the electronic card connector 10, which is related to Embodiment 1 of this invention, provides a common construction with the electronic card connector 10A, for this common portion, having the same symbols attached, by invoking this explanation, avoids a duplicate explanation, giving a detailed explanation for different constructions. The electronic card connector 10, as shown in FIGS. 1 and 2, provides a connector's main body 11 and a guide case 12 which joins to one end of this connector's main body 11, and has the structure where shutter member 16, which closes one part of this opening, is installed in slot 13a.

For the guide case 12, as shown in FIG. 2, a housing part B is formed which houses the shutter member 16 at one end of the slot 13a, that is, one side of the side plate 12b.

A narrow groove, nearly U-shaped, is formed for this housing part B, which is comprised of an elongated part 12a' for which one end of the surface plate 12a of the guide case 12 is elongated towards the exterior of the side plate 12b and a side plate 15a which bends, at right angles, from the location of the prescribed beam length W7, and the back plate 15b which further bends this side plate 15a towards the side plate 12c, and this U-shaped housing B becomes of a size which can house the cover 17 of the shutter member.

In addition, on the elongated part 12a' and the back plate 15b there are respectively formed small holes 12b' and 15b' at locations which adjoin the opening of the slot 13a. Into these small holes 12b' and 15b' are inserted the freely rotatable protrusions 17a and 17b of the cover 17.

Furthermore, the side plate 15a extends the prescribed length of one end, and covers the opening part of the housing part B by bending this elongated side piece 15a'. This opening part links with one end of the slot 13a. The cover 17, for this side piece 15a', of the later described shutter member 16 functions as a stopper so that there is no disengagement from the slot 13a.

Even the cover 17 of housing part B is folded and housed into this housing part B, because the distance $W_4$ between the free end 17c of the cover 17 and the side plate 12c is slightly longer than the beam length $W_1$ of the small-sized module 1, there can be insertion of the small-sized module 1 under conditions in which the cover has shut one part of the slot 13a. The shutter member 16, as is shown in FIG. 2, is formed by the cover 17 of a length that shuts (okay, but "shutters" could be used) one part of the slot 13a and by the spring 18 which applies a force so as to shut the slot 13a by this cover 17.

This cover 17 is formed from resin, having a prescribed length $W_5$ and beam length $W_6$, and thickness, and it is assumed that the thickness has slightly lower profile than height which intersects at right angles with the slot 13a.

The cylindrical protrusions 17a and 17b are formed at one end for this cover 17, and the protrusion 17a is inserted into each small hole 12b' and 15b' of the elongated part 12a' and the back plate 15b. From this arrangement, the cover 17 rotates the protrusion 17a as a pivot point. Moreover, the other end 17c of the cover 17 becomes a free end.

In addition, the small protrusion 17b is formed at a site which adjoins the protrusion 17a. On this protrusion 17b is installed the spring 18.

The length $W_5$ of the cover 17, when the cover 17 is installed so that one part of the slot 13a is closed, is set to a length for which the distance $W_4$ is formed between the free end 17c of the cover 17 and the side plate 12c.

This distance $W_4$ is slightly longer than the beam length $W_1$ of the small-sized module 1, and the module 1 becomes capable of insertion into the slot 13a under conditions in which the cover 17 closes the slot 13a. In addition, when the cover 17 is stored within the housing part B by folding into layers, the distance between the outer surface of the cover 17 and the side plate 12*c* is set to a length such that the large-sized module 3 can be housed.

Figure 5:
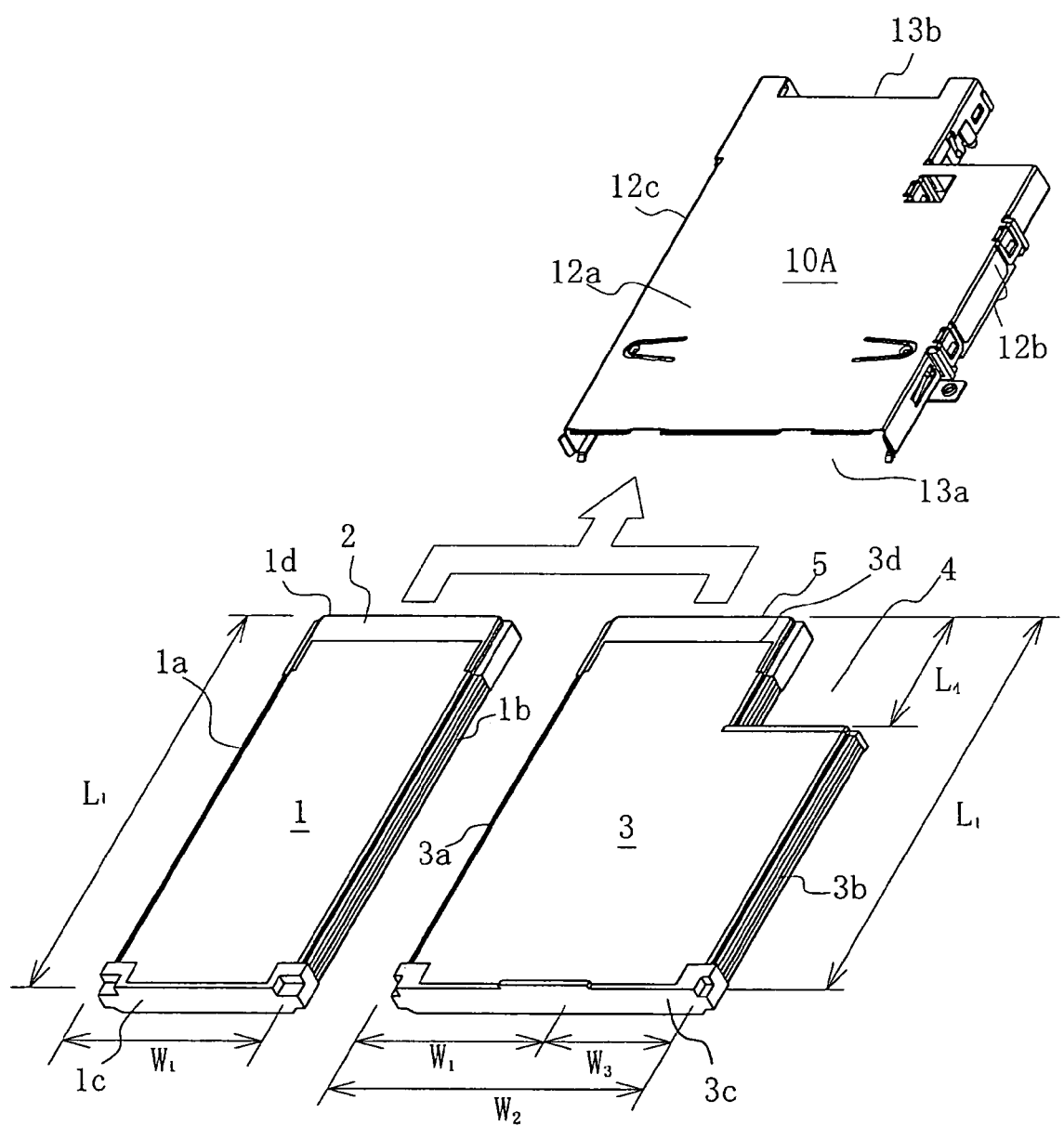
FIG. 5 is an exterior perspective view that shows the connection of two kinds of known modules and the connector.
Figure 6:
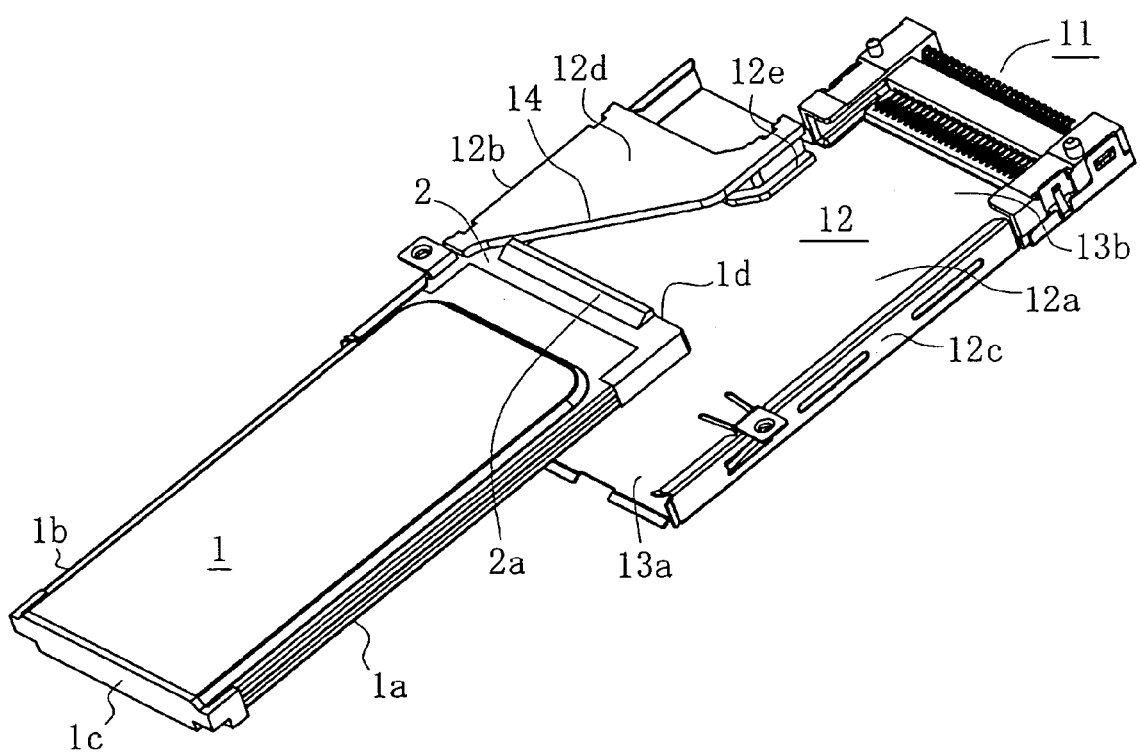
FIG. 6 turns inside out the connector of FIG. 5, and is an exterior perspective view that shows the connection with one module.

By making clear the relationships of every length "$W_1$–$W_7$" that have been explained up to this point by referencing FIG. 1 and FIG. 5, the following relationships result.

$$W_4 > W_1, W_2 > (W_4 + W_5 - W_7), W_7 > W_6$$

Consequently, with respect to the lengths $W_1$ and $W_2$ of each module 1 and 3, and by establishing according to the above-mentioned relations the lengths "$W_4$–$W_7$" of the slot 13*a* and shutter member 16, it is possible to connect each module 1 and 3 by smoothly inserting in slot 13*a*.

Figure 3A:
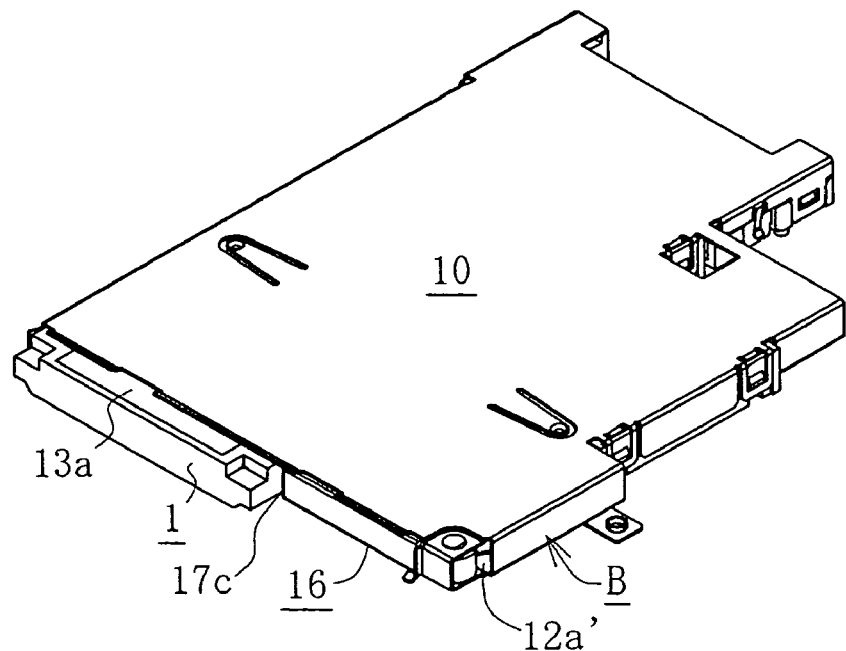
FIG. 3(a) is an exterior perspective view from the top surface.
Figure 3B:
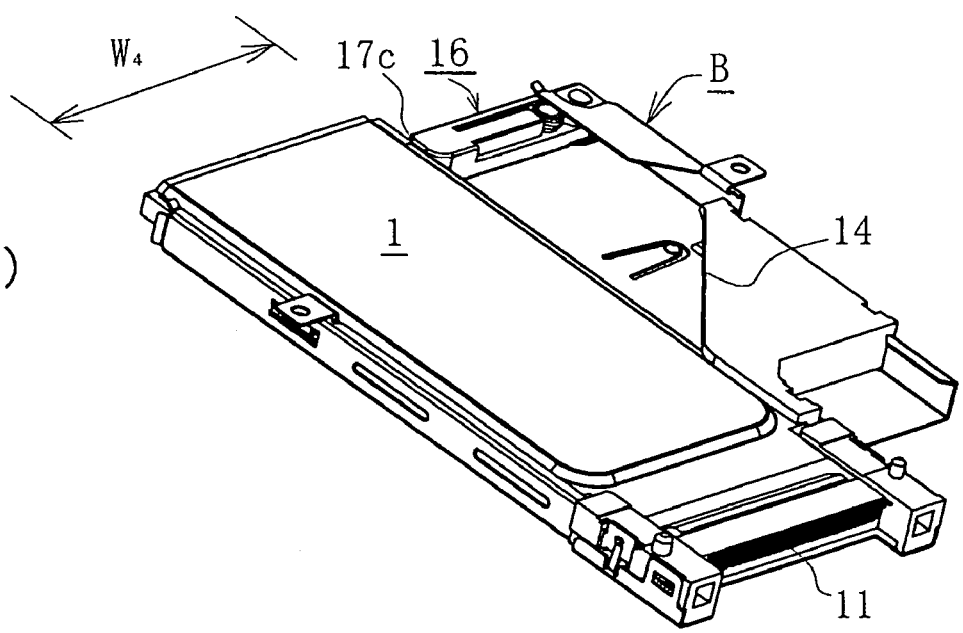
FIG. 3(b) is an exterior perspective view that turns inside out FIG. 3(a).
Figure 4A:
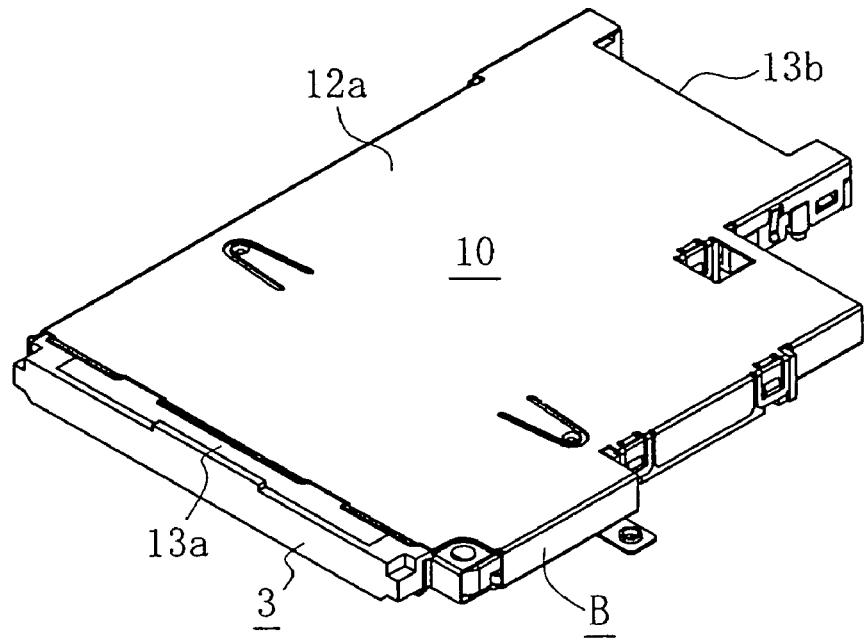
FIG. 4(a) is an exterior perspective view seen from the top surface.
Figure 4B:
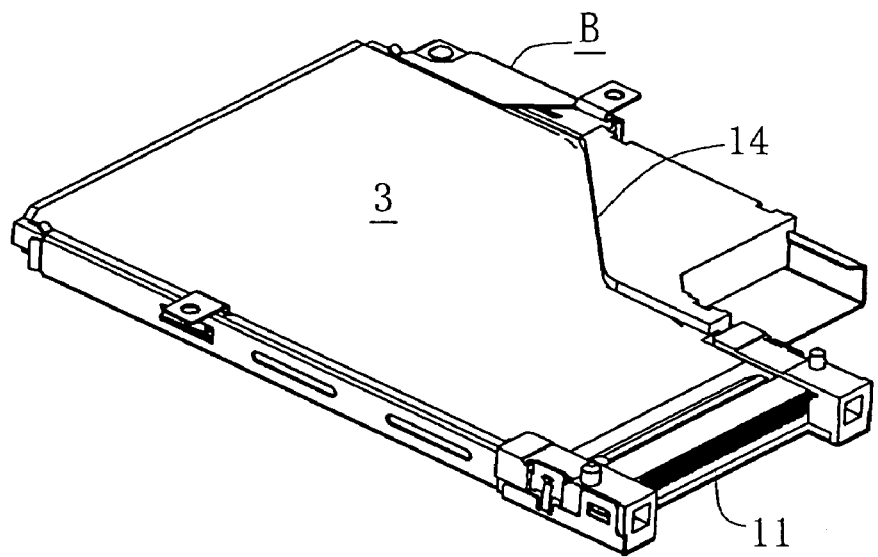
FIG. 4(b) is an exterior perspective view that turns inside out FIG. 4(a).

FIG. 3 shows the conditions that connect by insertion the module 1 to this invention's electronic card connector 10, and FIG. 3(*a*) is an exterior perspective view which is seen from the top surface, FIG. 3(*b*) is an exterior perspective view which turns inside out FIG. 3(*a*), FIG. 4 shows the conditions that connect by insertion the module 3 to this invention's electronic card connector 10, FIG. 4(*a*) is an exterior perspective view which is seen from the top surface, and FIG. 4(*b*) is an exterior perspective view that turns inside out FIG. 4(*a*).

When the small-sized module 1 is connected by insertion to the connector 10, as shown in FIG. 3, for the slot 13*a*, because one part is closed by the cover 17 of the shutter member 16, there is insertion of module 1 from the open part. By this insertion, because the connector's main body 11 is placed in the interior of the opened part of slot 13*a*, by further pushing module 1, it is possible to connect accurately to the connector's main body 11.

In addition, under the conditions where this module 1 is connected to the connector's main body 11, the side surface 1*b* of module 1 is connected with the free end 17*c* of the cover 17, and because this module 1 is respectively supported by the side plate 12*c* and the free end 17*c* of the cover 17, the connection with the connector's main body 11 is stable.

In addition, when module 3 connects with the connector 10, as shown in FIG. 4, for the slot 13*a*, a part of this is closed by the cover 17 of the shutter member 16, and the connector 5 portion of the module 3 is further pushed while connected with the cover 17. By this pushing, because the cover 17 is pivoted by the protrusion 17*a* which was rotatably inserted into the small holes 12*b'* and 15*b'*, there is housing by the housing part B, and the side surface of module 3 is guided by the side plates 12*b* and 12*c*, and connects with the connector's main body 11.

Under these connection conditions, the cover 17 of the shutter member 16 is brought into an evacuation state by being housed by the housing part B.

Consequently, when removing module 3, the cover 17, by the force of the spring 18, returns to its original position, and there results in the covering of one part of the slot 13*a*. This electronic card connector 10 can undergo various changes.

The electronic card connector 10 of the Embodiment 1 has two modules, but, is not limited to two modules, and more than or equal to 3 modules is permissible. When there are more than or equal to 3 modules, the electronic card connector, that is, the module, becomes of an intermediate size between the smallest size and the largest size. The length of the cover is selected according to these sizes, and also the size of the housing is formed according to a prescribed size.

Although a particular embodiment of the invention has been described in detail for purposes of illustration, additional advantages and modifications will readily appear to those skilled in the art, and various modifications and enhancements may be made without departing from the spirit and scope of the invention. Accordingly, the invention is not to be limited except as by the appended claims.

What is claimed is:

1. An electronic card connector, comprising,
a guide case in which is formed a universal slot which has an opening in which different sized electronic cards can be inserted;
a connector which is established in an interior of the universal slot and connected with one of the electronic cards,
wherein in the universal slot there is installed a rotatable shutter member which has a cover of prescribed length at an end of one side in a longitudinal direction of its opening, and
wherein the opening of the universal slot is filled by the cover of the shutter member by opening the opening of a size in which an electronic card of the smallest size can be inserted.

2. An electronic card connector as in claim 1 in which the guide ease forms a housing part which shelters the cover of the shutter member on a side to which the shutter member has been installed, and when a maximum sized electronic card is inserted in the universal slot, the cover of the shutter member is housed in the housing part.

* * * * *